United States Patent
Song et al.

(10) Patent No.: US 11,307,226 B2
(45) Date of Patent: Apr. 19, 2022

(54) METHOD FOR MONITORING ELECTRICAL ENERGY IN TRACTION POWER NETWORKS

(71) Applicant: Nanjing Institute of Railway Technology, Nanjing (CN)

(72) Inventors: Qihou Song, Changzhou (CN); Honggao Feng, Changzhou (CN); Baichuan Xu, Changzhou (CN)

(73) Assignee: Nanjing Institute of Railway Technology, Nanjing (CN)

( * ) Notice: Subject to any disclaimer, the term of this patent is extended or adjusted under 35 U.S.C. 154(b) by 284 days.

(21) Appl. No.: 16/706,816

(22) Filed: Dec. 8, 2019

(65) Prior Publication Data

US 2020/0408813 A1  Dec. 31, 2020

(30) Foreign Application Priority Data

Jun. 25, 2019  (CN) .......................... 201910564136.8

(51) Int. Cl.
*G01R 31/00* (2006.01)
*G01R 19/175* (2006.01)
*B60L 15/20* (2006.01)
*G01R 31/28* (2006.01)

(52) U.S. Cl.
CPC ............ *G01R 19/175* (2013.01); *B60L 15/20* (2013.01); *G01R 31/28* (2013.01); *B60L 2200/26* (2013.01)

(58) Field of Classification Search
CPC .... G01R 21/133; G01R 19/175; G01R 31/28; G01R 31/31701; G01R 31/31705; G01R 31/3177; G01R 13/32; G01R 13/345
See application file for complete search history.

(56) References Cited

U.S. PATENT DOCUMENTS

| | | | | |
|---|---|---|---|---|
| 8,983,790 B1* | 3/2015 | Merugu | ........... | G01R 31/31701 702/120 |
| 9,515,676 B2* | 12/2016 | Sugnet | ..................... | H03M 7/30 |
| 2005/0127891 A1* | 6/2005 | Bae | ......................... | G01N 17/02 324/72 |
| 2008/0024112 A1* | 1/2008 | Arrouy | .................. | G01R 15/22 324/73.1 |
| 2017/0129364 A1* | 5/2017 | Cui | ....................... | B60L 15/002 |

FOREIGN PATENT DOCUMENTS

CN          206540974      * 10/2017

* cited by examiner

*Primary Examiner* — Thang X Le
(74) *Attorney, Agent, or Firm* — Idea Intellectual Limited; Margaret A. Burke; Sam T. Yip

(57) ABSTRACT

The present invention provides a method for monitoring electrical power in high-speed rail traction power supply networks/systems, comprising: collecting voltage and current analog signals from a traction power supply system, and converting the voltage and current analog signals into voltage and current digital signals; obtaining, by a processing unit, digital signals and transfer commands; compressing, by the processing unit, the digital signals according to the transfer commands to digital signal frames; and constructing a data link between the processing unit and a storage unit and transmitting the compressed digital signal frame to the storage unit. The processing unit may use run-length coding algorithm to compress the digital signal to be stored to obtain several compressed digital signal frames. Under different conditions of data link, transmission of compressed digital signal frames is adjustable to improve the reliability of digital signal transmission.

14 Claims, 3 Drawing Sheets

METHOD FOR MONITORING ELECTRICAL ENERGY IN TRACTION POWER NETWORKS

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS-REFERENCE TO RELATED APPLICATIONS

This application claims priority to China Patent Application No. 201910564136.8 filed on Jun. 25, 2019; the disclosure of which is incorporated by reference herein in its entirety.

FIELD OF THE INVENTION

The present invention relates to high-speed rail traction power supply networks/systems, in particular to a method and apparatus for monitoring electrical energy and power quality of high-speed rail traction power supply networks/systems.

BACKGROUND OF THE INVENTION

High-speed railways refers to railways with high standard infrastructure designed to be used for safe and high-speed travel of trains at operating speed above 250 km/h.

With the rapid development of high-speed railways, the operating density of various lines is increasing, and power quality problems such as negative sequence, harmonics, voltage fluctuations, increase in line losses and reduction of actual capacity of the traction transformer brought to the traction power supply network have become increasingly prominent. In severe cases, it may even cause malfunctions of relay protection devices, irregular tripping of some line feeders, and pressure explosion tubes.

The existing hubs of railway traction power supply network have complex structures and many feeder circuits. In general, it is required to perform simultaneously multi-channel power quality monitoring, which would be very difficult to be implemented with traditional power quality monitoring devices. Traditional power quality monitoring devices are mostly used in household power supply systems and can only achieve detection of harmonic of 50th order or below. The detection of harmonic above 50th order in high-speed rail traction power supply networks/systems is becoming increasingly prominent. Traditional power quality monitoring devices cannot meet such requirement. Moreover, it is also required to address the issues that collected signals are often required to be transmitted for several times when communication condition is poor.

SUMMARY OF THE INVENTION

The purpose of this section is to summarize aspects of the invention and briefly introduce some preferred embodiments. Simplifications or omissions may be made to avoid obscuring the purpose of illustration, however such simplifications or omissions should not be used to limit the scope of the invention.

In view of the above-said existing electrical power monitoring method applied in high-speed rail traction power supply networks/systems, it is an objective of the present invention to provide a method and apparatus for storing and transmitting electrical power monitoring data of a high-speed rail traction power supply system to solve the problem that the collected signals are usually required to be transmitted several times when communication is poor, which in turn makes the signal transmission performance poor.

According to one aspect of the present invention, signals are compressed into digital signal frames and transmitted to the storage unit depending on the condition of a data link between the processing unit and the storage unit. When the conditions of the data link are good, it can transmit compressed digital signal frames of large sizes, when the conditions of the data link are not good, it can transmit compressed digital signal frames of small sizes. Transmission of digital signal frames can be adjustable under different conditions of the data link such that digital signal transmission performance is improved.

BRIEF DESCRIPTION OF THE DRAWINGS

Embodiments of the invention are described in more detail hereinafter with reference to the drawings, in which.

DETAILED DESCRIPTION

In the following description, for purposes of explanation, details of the technical solutions of the embodiments of the present invention are set forth with reference to the drawings to provide a thorough understanding of the embodiment of the disclosure. It is apparent, however, to one skilled in the art that the present disclosure may be practiced without these specific details or with an equivalent arrangement.

Figure 1:
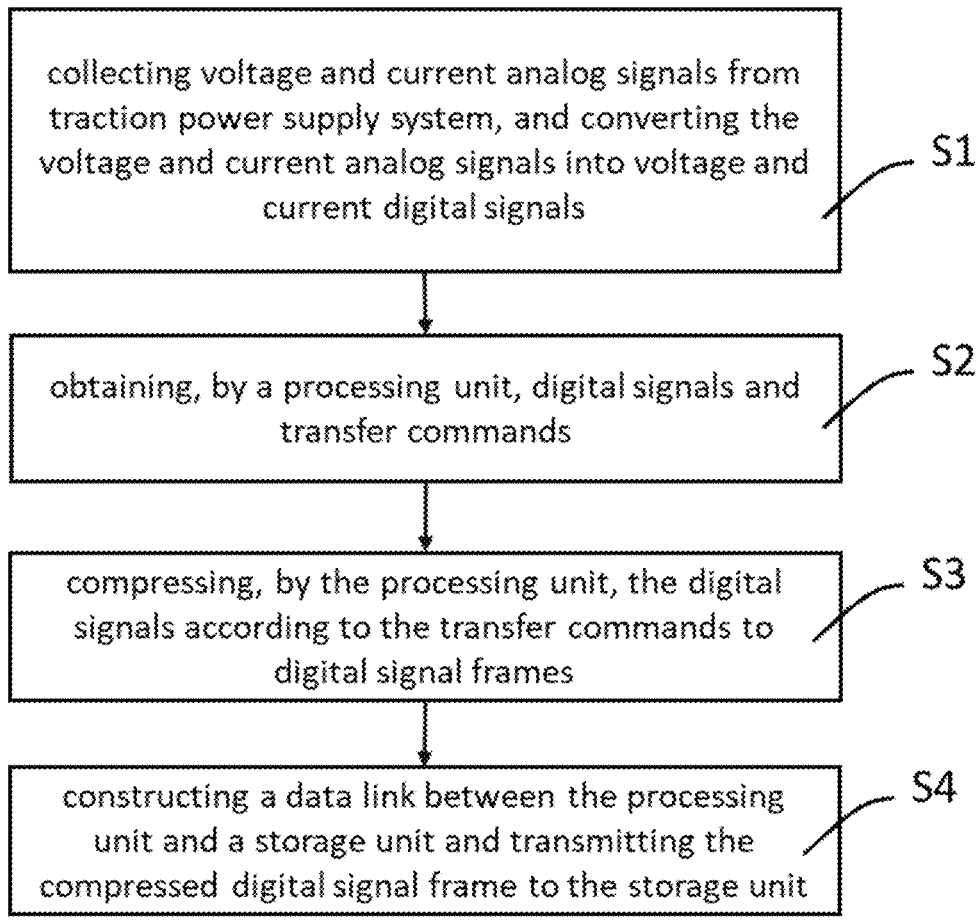
FIG. 1 is a schematic flowchart of a method for monitoring electrical power in a high-speed rail traction power supply system according to one embodiment of the present invention.

Referring to FIG. 1, a flowchart diagram of a method for monitoring electrical power in a high-speed rail traction power supply system is provided. As shown in FIG. 1, the method for monitoring electrical power may include steps:

S1: collecting voltage and current analog signals from the traction power supply system, and converting the voltage and current analog signals into voltage and current digital signals;

S2: obtaining, by a processing unit, the digital signals and transfer commands;

S3: compressing, by the processing unit, the digital signals according to the transfer commands to digital signal frames;

S4: constructing a data link between the processing unit and a storage unit, and transmitting the compressed digital signal frames to the storage unit.

Preferably, Step S2 may include steps:

S21: obtaining, by the processing unit, digital signals to be stored in the processing unit, wherein the digital signals to be stored may be digital signals that have not been stored in the processing unit. The processing unit may allocate different weighting factors to the digital signals according to time sequence of the digital signals being stored in the processing unit. The earlier the digital signal is stored in the processing unit, the smaller the weighting factor;

S22: obtaining, by the processing unit, transfer commands for the digital signals to be stored, wherein the processing unit may store the obtained digital signals in the processing unit. If the processing unit is operated for a long time, it will cause frequent failures and affect the acquisition and storage of the digital signals. In order to solve the frequent failure of the processing unit, with the processing unit obtaining the transfer commands for the digital signals to be stored and establishing a connection with the storage unit, it is required to store the digital signals of the processing unit to the storage unit during an exchange period between the processing unit and the storage unit. It should be noted that the transfer commands may be set up with a touch unit 500, and time intervals between sending each command can be set with a setting button of the touch unit 500 or adjusted with a signal transfer button of the touch unit 500, etc.

Specifically, in Step S3, the processing unit may perform compression on the digital signals to be stored by using a run-length encoding algorithm. The size of the resulting compressed digital signal frames is lower than the size of the digital signal to be stored. Therefore, the processing unit can reduce the required capacity. If the size of digital signals to be stored is large, it can be compressed into several digital signal frames. For example, if the size of the digital signal to be stored is 2000*1024 bits, it can be compressed into digital signal frames of 800*600 bits. Compared to the size of the digital signal to be stored, the size of each compressed digital signal frame is much smaller. Therefore, it will be more efficient to transmit the compressed digital signal frames than the digital signals to be stored.

Specifically, the processing unit may use run-length coding algorithm to compress the digital signal to be stored to obtain several compressed digital signal frames. It should be noted that the run-length coding algorithm may be set up by the processing unit in advance. Alternatively, the run-length coding algorithm may be replaced with a dictionary-based algorithm. The processing unit can pre-set, together with the storage unit, to store a dictionary with key names and values and use the dictionary as a set encoding information. The processing unit can also construct by itself an encoding information which acts as the set encoding information. The processing unit may utilize the set encoding information to perform compression on the digital signals to be stored to obtain the compressed digital signal frames which can be transmitted with improved reliability.

Preferably, in Step S4, both of the processing unit and the storage unit may establish the data link between the processing unit and the storage unit. It should be noted that before the data link is constructed, the processing unit should receive a confirmation message from the storage unit, or the storage unit should receive a confirmation message from the processing unit. For example, the storage unit may be configured to store a character string such as "aaaa" as a confirmation message, and the processing unit should send a character string of "aaaa" to the storage unit to establish a data link.

Further, the processing unit may transmit the compressed digital signal frames to the storage unit depending on the condition of the data link between the processing unit and the storage unit, and the processing unit may transmit different compressed digital signal frames under different conditions of data link.

It should be noted that the way of constructing the data link between the processing unit and the storage unit and transmitting the compressed digital signal frame to the storage unit may include:

if the condition of the data link between the processing unit and the storage unit is that the transmission speed of the data link is low, the processing unit may transmit compressed digital signal frames with small weighting factors to the storage unit;

if the condition of the data link between the processing unit and the storage unit is that the transmission speed of the data link is high, the processing unit may transmit compressed digital signal frames with large weighting factors to the storage unit.

Under different conditions of data link, transmission of compressed digital signal frames is adjustable to improve the reliability of digital signal transmission.

Preferably, when the status of the data link between the processing unit and the storage unit is under the condition that the transmission speed of the data link is high, the processing unit may transmit several compressed digital signal frames to the storage unit by means of multi-processing. It should be noted that the processing unit can execute multi-processing. Under the condition that the status of the data link is the transmission speed of the data link being high, it can transmit concurrently a plurality of compressed digital signal frames by means of multi-processing. For example, if the processing unit has performed K concurrent processes, it may transmit concurrently K compressed digital signal frames, where K is a natural number.

Further, depending on the conditions of the data link between the processing unit and the storage unit, the processing unit can perform the following steps before transmitting the compressed digital signal frames to the storage unit:

the processing unit may transmit a set decoding information corresponding to a set encoding information to the storage unit, and the set decoding information is used for the storage unit to perform decoding on the received compressed digital signal frame;

after the processing unit uses the set encoding information to perform compression on a digital signal to be stored to obtain a compressed digital signal frame, in order to allow the storage unit to obtain the digital signal to be stored after receiving the compressed digital signal frame, the processing unit should send the set decoding information corresponding to the set encoding information to the storage unit, so that the storage unit can use the set decoding information to decode the received compressed digital signal frame.

Further, the processing unit may perform the following steps after transmitting a plurality of compressed digital signal frames to the storage unit depending on the conditions of the data link between the processing unit and the storage unit:

the processing unit monitors whether the data link between the processing unit and the storage unit is interrupted;

if the data link is interrupted, the processing unit registers or marks compressed digital signal frames that have not been transmitted or have been unsuccessfully transmitted as "un-transmitted";

if the data link between the processing unit and the storage unit is restored, the processing unit may transmit the compressed digital signal frames being registered or marked as "un-transmitted" to the storage unit.

Unsuccessful transmission of the compressed digital signal frame may be caused by unexpected interruption of the data link when the processing unit is still transmitting the compressed digital signal frames. Generally, after the processing unit transmits a compressed digital signal frame to the storage unit, if the storage unit successfully receives the compressed digital signal frame, it will return a response message to the processing unit. After the processing unit receives the response message, it will register or mark the compressed digital signal frame as "transmitted". If the processing unit does not get the response message, it will register or mark the compressed digital signal frame as "un-transmitted".

The compressed digital signal frames are transmitted to the storage unit depending on the condition of the data link between the processing unit and the storage unit. When the condition of the data link is good, the compressed digital signal frames with large sizes are transmitted. When the conditions are not good, compressed digital signal frames with small sizes are transmitted. Therefore, the transmission of the compressed digital signal frames can be adjusted under different data link conditions to improve the performance of digital signal transmission.

Figure 2:
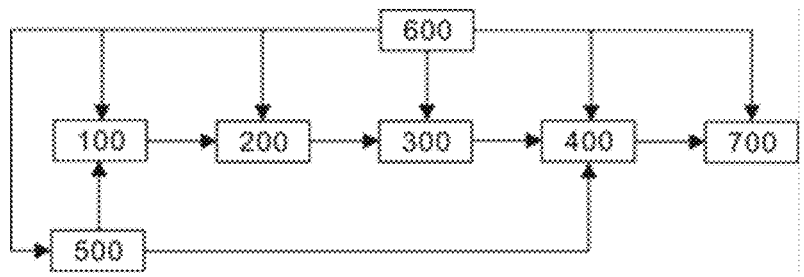
FIG. 2 is a connection block diagram of device units of an apparatus for monitoring electrical power in the high-speed rail traction power supply system according to one embodiment of the present invention.

Referring to FIG. 2, the method for monitoring electrical power in the high-speed rail traction power supply system may be implemented by an apparatus for monitoring electrical power in the high-speed rail traction power supply system. Specifically, the apparatus for monitoring electrical power may comprise a collection unit 100, a communication unit 200, a conversion unit 300, and a processing unit 400. The collection unit 100 may be configured to have functions of collection, preprocessing and summation, and connected to the conversion unit 300. The conversion unit 300 may be configured to establish a connection with the processing unit 400 through the communication unit 200. The collecting unit 100 is used to collect voltage and current analog signals and transmit the voltage and current analog signals to the conversion unit 300; the conversion unit 300 is used to convert the received voltage and current analog signals into voltage and current digital signals; the communication unit 200 is used for data communication between the conversion unit 300 and the processing unit 400; and the processing unit 400 is used for calculation, storage, output, and recording of query data. It should be noted that the communication unit 200 may include a data acquisition card (e.g. PCI8622 data acquisition card) and a communication connection module (e.g. DB-37 communication connection module) which are responsible for multi-channel fast analog-to-digital (AD) conversion.

Figure 3:
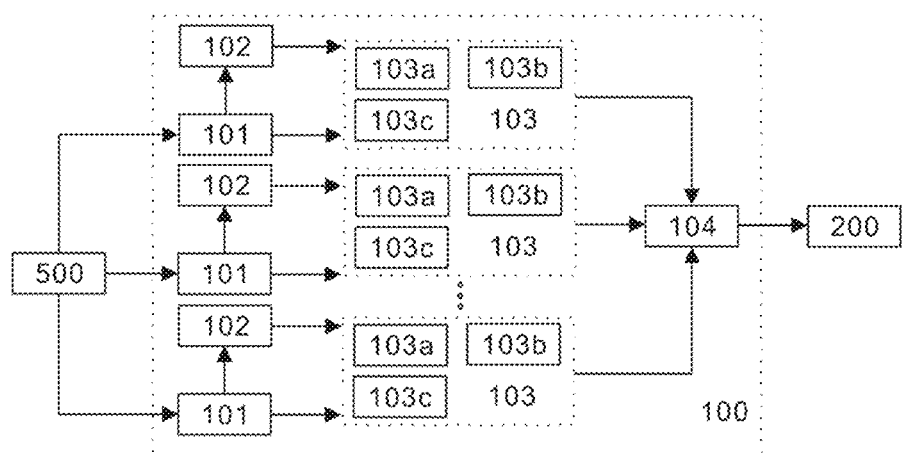
FIG. 3 is a schematic diagram of the apparatus for monitoring electrical power in the high-speed rail traction power supply system according to one embodiment of the present invention.

Further, as shown in FIG. 3, the collection unit 100 may include a power supply module 101, a collection module 102, a pre-processing module 103, and a summation module 104. The power supply module 101 is connected to the collection module 102 and the pre-processing module 103, and the collection module 102 may be configured to collect voltage and current analog signals from the power supply system, and the collected analog signals are output to the pre-processing module 103. The pre-processing module 103 may be configured to amplify, filter and phase-lock the analog signals received from the collection module 102. The summation module 104 may be configured to summarize multi-channel signals in the traction supply power system. The collection module 102 may be configured to establish a connection with the summation module 104 through the pre-processing module 103, wherein the summation module 104 is connected to the conversion unit 300. It should be noted that the pre-processing module 103 may include a signal conversion circuit 103a, a filter circuit 103b and a phase-lock circuit 103c. In this exemplary embodiment, the power supply module 101 is a voltage step-up circuit which can convert 220V AC to ±5V and ±12V DC and supply to the collection module 102 and the pre-processing module 103. The collection module 102 may comprise a voltage and current collection circuit and an amplifier circuit. The summation module 104 may be composed of a voltage and current summation circuit and a filter circuit.

Moreover, the apparatus for monitoring electrical power may further include a touch unit 500, a power supply module 600, and a storage unit 700. The power supply module 600 is connected with and supply power to the collection unit 100, the communication unit 200, the conversion unit 300, the processing unit 400, the touch unit 500 and the storage unit 700, respectively. The touch unit 500 is connected to the collection unit 100 and the processing unit 400 respectively, and the processing unit 400 is connected to the storage unit 700. It should be noted that the power supply module 600 may be a UPS power supply device and configured to provide power to all other units of the apparatus for monitoring electrical power in the high-speed rail traction power supply system such that the impact of external power supply instability and power failure on the device may be avoided. The processing unit 400 and the storage unit 700 may be computing devices. The touch unit 500 may be a display screen configured with buttons and/or a touch screen for displaying the measurement data of the monitored electrical power, and facilitating operation by relevant users.

The apparatus for monitoring electrical power of the high-speed rail traction power supply system solves the problem that it is difficult for a railway junction to realize multi-loop synchronous monitoring. It can also solve the problem of not being able to detect harmonics of order at $50^{th}$ or above and facilitate detection and analysis of power quality problems such as negative sequence, harmonics, and voltage fluctuations in traction power supply networks/systems. The invention has the advantages of small input power, high sampling accuracy, and good electromagnetic compatibility. It also has functions such as wave recording and query recording which are helpful for identifying problems and concluding rules, thus providing an analytical basis for power quality monitoring in high-speed rail traction power supply networks/systems.

The collection unit, the communication unit, the conversion unit, the processing unit, the power supply module and the storage unit 700 are positioned in a casing body of the apparatus for monitoring electrical power; and the touch unit is embedded on a front panel of the casing body.

Figure 4:
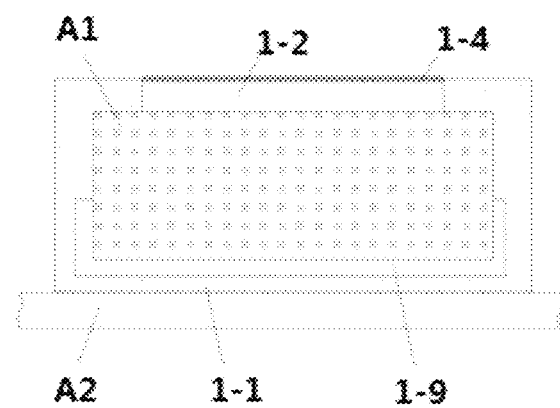
FIG. 4 is a detailed connection diagram of a collection unit of the apparatus for monitoring electrical power in the high-speed rail traction power supply system according to one embodiment of the present invention.
Figure 5:
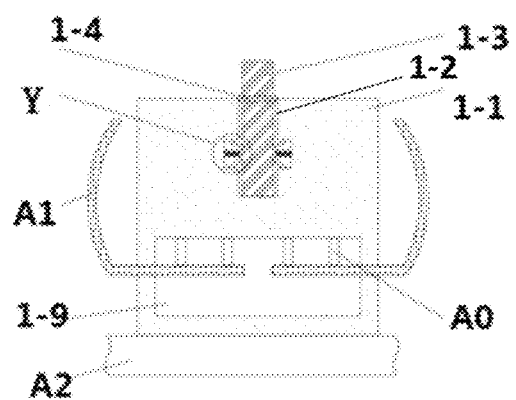
FIG. 5 is a schematic side view of a processing unit of the apparatus for monitoring electrical power in the high-speed rail traction power supply system according to one embodiment of the present invention.

Referring to FIGS. 4 and 5, the processing unit 400 may be embedded in a support base 1-1 positioned in the casing body. Specifically, the support base 1-1 may be provided with a receptacle 1-2, and the receptacle 1-2 may be configured to provide a space for installation and initially positioning and clamping of the processing unit 400. The processing unit 400 may has a housing 1-3 which may be embedded in the receptacle 1-2; wherein, the interface between the housing 1-3 and the receptacle 1-2 may be provided with a covering sheet 1-4 which is made of plastic material.

Figure 6:
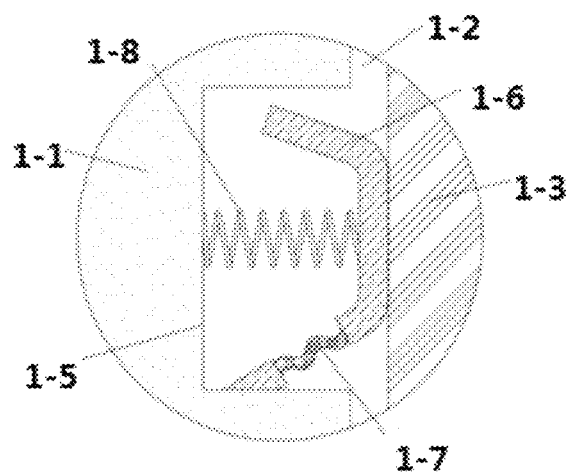
FIG. 6 is a partially enlarged schematic diagram of the "Y" portion of the processing unit of the apparatus for monitoring electrical power in the high-speed rail traction power supply system according to one embodiment of the present invention.

Further, as shown in FIG. 6, the receptacle 1-2 may has inner walls being symmetrically provided with at least two positioning ports 1-5, wherein each of the positioning ports 1-5 may be provided with a locking member Y for further clamping and fixing the processing unit 400. The locking member Y may include a positioning plate 1-6, a strain block 1-7, and an elastic body 1-8. The elastic body 1-8 may comprise two ends being respectively connected to an inner wall of the positioning port 1-5 and the positioning plate 1-6. The strain block 1-7 may comprise two ends being connected respectively to an inner wall of the positioning port 1-5 and the positioning plate 1-6. It should be noted that the side view of the positioning plate 1-6 may have a shape similar to a side view of a spoon; the strain block 1-7 may have a wave-shaped structure; and the elastic body 1-8 may be spring or have a spiral structure. Both of the positioning plate 1-6 and the strain block 1-7 may be made of aluminum alloy and the elastic body 1-8 may be made of beryllium copper wires.

Further, as shown in FIGS. 4 and 5, the casing body may further have a heat collecting chamber 1-9 positioned below the receptacle 1-2. The heat collecting chamber 1-9 may have an inner surface being attached with one or more fins A0. The casing body may further comprise one or more cooling sheets A1. Each of the cooling sheets A1 may have one end being arranged inside the heat collecting chamber 1-9 and connected with fins A0 and another end being arranged to pass through and extend beyond the support base 1-1. The materials of fins A0 and cooling sheets A1 may be aluminum alloy or any other materials having good thermal conductivity. After a long operating period, the processing unit 400 will generate a lot of heat such that the support base 101 will be heated up to a very high temperature. Owning to the high thermal conductivity of the fins A0 and the cooling sheets A1 in combination of the temperature difference between the cooling sheets A1 and the external environment, the generated heat may be collected into the heat collecting chamber 1-9 through the fins A0 and then transmitted from the fins A0 to the cooling sheets A1 and then dissipated to external environment through the cooling sheets A1. There is no need to open a through opening or use a rotary blade for cooling, and it can effectively avoid diffusion of particle impurities into the support base 1-1. In one embodiment, the ends of the cooling sheets A1 extending beyond the support base 1-1 may be configured to surround the support base 1-1 so as to provide protection to the support base 1-1. The casing body may further have a protection block A2 being positioned below the support base 1-1. The protection block A2 may be made of aluminum alloy and attached to support base 1-1 by welding.

As shown in FIG. 5, with the positioning plate 1-6, the strain block 1-7 and the elastomer 1-8, an user may plug the housing 1-3 of the processing unit 400 into the receptacle 1-2 such that the housing 1-3 may be configured to be in contact with and push against the positioning plate 1-6 to bend the strain block 1-7 and deform the elastic body 1-8. Under the reaction of the strain block 1-7 and the elastic body 1-8, movement of the housing 1-3 can be effectively limited and shaking of the processing unit 400 can be avoided. Further, the plastic covering sheet 1-4 may be configured to cover gaps formed between the housing 1-3 and the receptacle 1-2.

It should be noted that the foregoing description are only for purpose of illustrating the technical solution of the present invention and shall not be limiting. Although the present invention has been described in detail with reference to the preferred embodiments, those skilled in the art should understand that modifications, combinations and equivalent substitutions of the technical solution of the present invention can be carried out without departing from the spirit and scope of the present invention, and should all be covered by the scope of the claims of the present invention.

What is claimed is:

1. A method for monitoring electrical power in a high-speed rail traction power supply system, comprising:
    collecting voltage and current analog signals from the traction power supply system, and converting the voltage and current analog signals into voltage and current digital signals;
    obtaining, by a processing unit, the digital signals and a transfer command;
    compressing, by the processing unit, the digital signals to digital signal frames according to the transfer command; and
    constructing a data link between the processing unit and a storage unit and transmitting the compressed digital signal frame to the storage unit, wherein constructing a data link between the processing unit and a storage unit and transmitting the compressed digital signal frame to the storage unit comprises transmitting, by the processing unit, compressed digital signal frames with small weighting factors to the storage unit if transmission speed of the data link is low; and
    transmitting, by the processing unit, compressed digital signal frames with large weighting factors to the storage unit if transmission speed of the data link is high.

2. The method of claim 1, wherein the compression of the digital signals comprises using, by the processing unit, a run-length encoding algorithm to compress the digital signals to a plurality of digital signal frames.

3. The method of claim 2, wherein the construction of the data link between the processing unit and the storage unit comprises:
    transmitting, by the processing unit, a set decoding information corresponding to a set encoding information to the storage unit; and
    decoding, by the storage unit, compressed digital signal frames received from the processing unit with the set decoding information.

4. The method of claim 1, wherein the transmission of the compressed digital signal frames to the storage unit comprises:
    monitoring, by the processing unit, whether the data link between the processing unit and the storage unit is interrupted;
    registering or marking, by the processing unit, compressed digital signal frames that have not been transmitted or have been unsuccessfully transmitted as "un-transmitted" when the data link is interrupted; and
    transmitting, by the processing unit, compressed digital signal frames being registered or marked as "un-transmitted" to the storage unit when the data link between the processing unit and the storage unit is restored.

5. The method of claim 4, wherein the method is implemented by an apparatus for monitoring electrical power in the high-speed rail traction power supply system.

6. The method of claim 5, wherein the apparatus for monitoring electrical power comprises a collection unit, a communication unit, a conversion unit, and a processing unit;
wherein:
the collection unit is connected to the conversion unit;
the conversion unit is connected to the processing unit through the communication unit;
the collection unit is for collecting voltage and current analog signals and transmitting the voltage and current analog signals to the conversion unit;
the conversion unit is for converting the voltage and current analog signals into voltage and current digital signals;
the communication unit is for data communication between the conversion unit and the processing unit; and
the processing unit is for calculation, storage, output, and recording of query data.

7. The method of claim 6, wherein the collection unit includes a power supply module, a collection module, a pre-processing module, and a summation module;
wherein:
the power supply module is connected to the collection module and the pre-processing module;
the collection module is configured to establish a connection with the summation module through the pre-processing module; and
the summation module is connected to the conversion unit.

8. The method of claim 7, wherein the pre-processing module comprises a signal conversion circuit, a filter circuit and a phase-lock circuit.

9. The method of claim 8, wherein the apparatus for monitoring electrical power further comprises a touch unit, a power supply module, and a storage unit;
wherein:
the power supply module is connected with and supply power to the collection unit, the communication unit, the conversion unit, the processing unit, the touch unit and the storage unit, respectively;
the touch unit is connected to the collection unit and the processing unit, respectively; and
the processing unit is connected to the storage unit.

10. The method of claim 9, wherein the collection unit, the communication unit, the conversion unit, the processing unit, the power supply module and the storage unit 700 are positioned in a casing body of the apparatus for monitoring electrical power; and
the touch unit is embedded on a front panel of the casing body.

11. The method of claim 10, wherein the processing unit is embedded in a support base positioned in the casing body.

12. The method of claim 11, wherein:
the support base is provided with a receptacle and a covering sheet;
the processing unit further comprises a housing being embedded in the receptacle; and
the covering sheet is configured to cover gaps formed between the housing and the receptacle.

13. The method of claim 12, wherein the receptacle has inner walls being symmetrically provided with at least two positioning ports and each of the positioning ports is provided with a locking member.

14. The method of claim 13, wherein the locking member comprises a positioning plate, a strain block, and an elastic body;
wherein:
the elastic body comprises two ends being respectively connected to a first inner wall of the positioning port and the positioning plate; and
the strain block comprises two ends being connected respectively to a second inner wall of the positioning port 1-5 and the positioning plate.

* * * * *